United States Patent
Deshmukh et al.

(10) Patent No.: US 6,653,237 B2
(45) Date of Patent: Nov. 25, 2003

(54) HIGH RESIST-SELECTIVITY ETCH FOR SILICON TRENCH ETCH APPLICATIONS

(75) Inventors: Shashank Deshmukh, San Jose, CA (US); David Mui, San Jose, CA (US); Jeffrey D. Chinn, Foster City, CA (US); Dragan V Podlesnik, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/893,859

(22) Filed: Jun. 27, 2001

(65) Prior Publication Data

US 2003/0003752 A1 Jan. 2, 2003

(51) Int. Cl.$^7$ ............... H01L 21/302; H01L 21/3065
(52) U.S. Cl. ............... 438/700; 438/706; 438/712; 438/719
(58) Field of Search ............... 438/700, 706, 438/712, 719

(56) References Cited

U.S. PATENT DOCUMENTS

| | | | | |
|---|---|---|---|---|
| 4,702,795 A | * | 10/1987 | Douglas | 156/643 |
| 4,741,799 A | * | 5/1988 | Chen et al. | 156/643 |
| 5,053,104 A | * | 10/1991 | Babu et al. | 156/643 |
| 5,425,842 A | | 6/1995 | Zijlstra | 156/643.1 |
| 5,444,259 A | * | 8/1995 | Ohmi | 250/452.21 |
| 5,522,966 A | | 6/1996 | Komura et al. | 156/662.1 |
| 5,562,801 A | * | 10/1996 | Nulty | 156/634.1 |
| 5,772,906 A | * | 6/1998 | Abraham | 216/72 |
| 5,865,938 A | * | 2/1999 | Peeters et al. | 156/345 |
| 5,874,317 A | * | 2/1999 | Stolmeijer | 438/296 |
| 5,880,007 A | * | 3/1999 | Varian et al. | 438/427 |
| 5,885,402 A | * | 3/1999 | Esquibel | 156/345.25 |
| 5,935,874 A | * | 8/1999 | Kennard | 438/710 |
| 6,033,969 A | * | 3/2000 | Yoo et al. | 438/425 |
| 6,036,878 A | * | 3/2000 | Collins | 216/68 |
| 6,074,954 A | | 6/2000 | Lill et al. | 438/710 |

* cited by examiner

Primary Examiner—Benjamin L. Utech
Assistant Examiner—Lynette T. Umez-Eronini
(74) Attorney, Agent, or Firm—Mayer Fortkort and Williams; Joseph Bach

(57) ABSTRACT

Processes for forming trenches within silicon substrates are described. According to an embodiment of the invention, a masked substrate is initially provided that comprises (a) a silicon substrate and (b) a patterned resist layer over the silicon substrate. The patterned resist layer has one or more apertures formed therein. Subsequently, a trench is formed in the substrate through the apertures in the resist layer by an inductive plasma-etching step, which is conducted using plasma source gases that comprise $SF_6$, at least one fluorocarbon gas, and $N_2$. If desired, $Cl_2$ can also be provided in addition to the above source gases. The process of the present invention produces chamber deposits in low amounts, while providing high etching rates, high silicon-:resist selectivities, and good trench sidewall profile control.

23 Claims, 2 Drawing Sheets

US 6,653,237 B2

HIGH RESIST-SELECTIVITY ETCH FOR SILICON TRENCH ETCH APPLICATIONS

BACKGROUND OF THE INVENTION

1. Field of the Invention

The present invention relates to methods of etching trenches in silicon, and more particularly to methods of etching trenches in silicon while maintaining good photoresist selectivity.

2. Brief Description of the Background Art

A number of semiconductor devices, including optical waveguides, optical switches and MOSFET (metal oxide semiconductor field effect transistor) devices require the formation of silicon trenches at some point in their fabrication. Depending on the application, trench depths typically range from 1 to 4 microns in width and 0.5 to 5 in depth, although depths and widths beyond these ranges are clearly possible. In order to etch such silicon trenches, either a photoresist mask or an oxide hard-mask is typically used.

The use of an oxide hard-mask in the process integration sequence is presently preferred, because silicon etching at high etch rates, along with high selectivity relative to the oxide mask, is readily achieved using halogen-based chemistry ($CF_4$, $Cl_2$, $SF_6$, etc.) with oxygen addition. For instance, with $SF_6/O_2$ chemistry, high etch rates, for example >1 micron/min (i.e., >10,000 Angstroms/min), can be achieved, along with very high silicon:mask selectivity, for example, >20:1. In addition, the process produces low levels of chamber deposits, allowing high mean wafers between cleans (MWBC) values to be achieved. However, in producing the hard mask, a layer of the hard mask material (typically an oxide) is first provided, followed by the application of a resist mask, after which the hard mask material is etched through apertures in the resist mask. As a result, relative to processes in which trenches are directly defined with a photoresist mask, an additional oxide-etching step is required to define the mask, and the associated cost is undesirable for low cost (and hence low margin) and high volume devices.

Defining trenches with a photoresist mask simplifies the integration sequence and allows sidewall taper to be controlled. However, traditional silicon/polysilicon etch chemistry is typically based on $HBr/Cl_2$ chemistry, which has its own limitations. For example, the etch rates with $HBr/Cl_2$ chemistry are limited to only about 3000 Å/min or less, limiting process throughput. Moreover, the silicon:resist selectivity with this chemistry has an upper limit of about 2.5:1. Finally, this chemistry produces significant chamber deposition.

Other chemistries are known, such as $SF_6/HBr/O_2$ chemistry and $SF_6/CFH_3/O_2$ chemistry, which have somewhat better etch rates (about 1 micron/min) and comparable silicon:resist selectivities (about 2–3:1), but produce trenches with rough sidewalls.

SUMMARY OF THE INVENTION

The present invention is directed to improved methods for forming a trench within a silicon substrate. According to one embodiment of the invention, a masked substrate is initially provided that comprises (a) a silicon substrate and (b) a patterned resist layer over the silicon substrate. The patterned resist layer has one or more apertures formed therein. Subsequently, a trench is formed in the substrate through the apertures in the resist layer by an inductive plasma-etching step, which is conducted using plasma source gases that comprise $SF_6$ and at least one fluorocarbon gas. Preferred pressures for this process range from 5–70 mT, more preferably 10–20 mT. Preferred fluorocarbon gases are $CHF_3$, $CH_2F_2$ and $C_4F_8$, with $CHF_3$ being more preferred. Preferred $SF_6:CHF_3$ volume ratios range from 1:1 to 1:10, more preferably from 1:3 to 1:8. Preferably, $N_2$ is added to the source gases of the above process. Preferred ($SF_6+CHF_3$):$N_2$ volume ratios preferably range from 1:3 to 5:1, more preferably from 1:2 to 2:1.

According to a further embodiment of the present invention, $Cl_2$ is added to the source gases of the above process. Preferred amounts of $Cl_2$ range from 1 to 80% of the volume of $SF_6$ present in the source gases, more preferably from 5 to 40%. With the addition of $Cl_2$, the taper of the trench sidewalls can be varied, for example, to between 88 to 89 degrees in taper.

The processes of the present invention are capable of providing etching rates that range, for example, from 0.5 to 2 microns per minute and silicon:resist selectivities ranging, for example, from 3:1 to 6:1.

One advantage of the present invention is that silicon trenches can be formed at high etch rates relative to traditional $HBr/Cl_2$ chemistry, leading to significant improvements in process throughput.

Another advantage of the present invention is that silicon trenches can be formed with high silicon:resist selectivity relative to traditional $HBr/Cl_2$ chemistry.

Another advantage of the present invention is that trenches can be formed with good profile control.

Yet another advantage of the present invention is that chamber deposits are reduced relative to traditional $HBr/Cl_2$ chemistry, due to the fluorine-based chemistry of the present invention. Hence, MWBC values are increased.

The above and other embodiments and advantages of the present invention will become immediately apparent to those of ordinary skill in the art upon reading the detailed description and claims to follow.

DETAILED DESCRIPTION OF PREFERRED EMBODIMENTS OF THE INVENTION

As a preface to the detailed description, it should be noted that, as used in this specification and the appended claims, the singular forms "a", "an", and "the" include plural referents, unless the context clearly dictates otherwise.

All percentages (%) listed for gas constituents are % by volume, and all ratios listed for gas constituents are volume ratios.

The term "selectivity" is used to refer to a) a ratio of etch rates of two or more materials and b) a condition achieved during etch when etch rate of one material is increased in comparison with another material.

Preferably, etching is carried out in a DPS (decoupled plasma source) etching system. However, it should be appreciated that other inductively coupled plasma sources can be used. Such plasma sources are capable of producing high-density plasmas (e.g., ion densities of $10^{11}$ to $10^{12}$ $cm^{-3}$).

Figure 1:
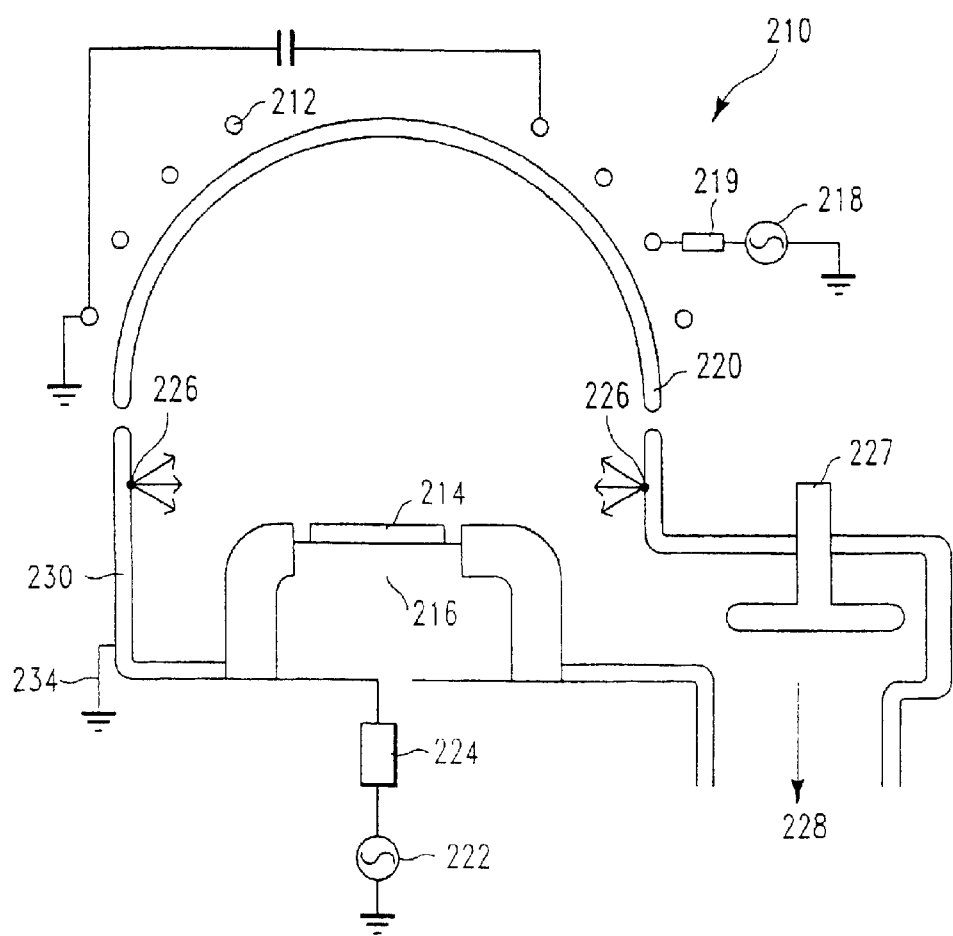
FIG. 1 is a schematic diagram of an exemplary etching system that may be used in connection with embodiments of the invention.

A schematic diagram of one such system, which is disclosed in U.S. Pat. No. 6,074,954, the entire disclosure of which is incorporated by reference, is found in FIG. 1. This Figure illustrates an etching process chamber 210, which is constructed to include at least one inductive coil antenna segment 212, positioned exterior to a dielectric, shaped ceiling 220, and connected to a radio frequency (RF) power generator 218 (which may be a source power generator with a frequency tunable around 12.56 MHz for impedance matching at different plasma conditions, or which may be a source power generator of fixed frequency which is connected through an impedance matching network 219). Process chamber 210 also includes a substrate 214 on a support pedestal (cathode) 216, which is connected to an RF frequency power generator 222 (which may be a bias power generator at a fixed frequency ranging between about 400 kHz and 13.56 MHz) through an impedance matching network 224, and a conductive chamber wall 230, which serves as the electrical ground 234.

The semiconductor substrate 214 is placed on the support pedestal 216 and gaseous components are fed into the process chamber through entry ports 226. A plasma is ignited in process chamber 210 by applying RF powers via 218 and 222. Pressure within the etch process chamber 210 is controlled using a vacuum pump (not shown) and a throttle valve 227 situated between process chamber 210 and the vacuum pump by which gaseous species 228 are removed. The temperature on the surface of the etch chamber walls is controlled using liquid-containing conduits (not shown), which are located in the walls of the etch chamber 210. The temperature of the semiconductor substrate is controlled by stabilizing the temperature of the support pedestal and flowing helium gas in the channels formed by the back of the substrate and grooves (not shown) on the pedestal 216 surface. The helium gas is used to facilitate heat transfer between the substrate and the pedestal. During the etch process, the substrate surface is gradually heated by the plasma to a steady state temperature which is approximately 5 to 30° C. higher than the substrate support pedestal temperature, depending on the process conditions. Substrate support pedestal (cathode) temperatures preferably range from 10 to 70° C., more preferably 10–30° C., to maximize sidewall deposition and enhance passivation. The surfaces of the etching chamber 210 walls are typically maintained at about 50° (to prevent unwanted deposition) using the cooling conduits previously described.

The RF power applied to the inductive coil antenna segment 212 (source power) and to the substrate pedestal 216 (bias power) may be selected to range from about 50 kHz to as high as 13.56 MHz, with a frequency of 13.56 MHz being preferred for the bias power and 12.56 MHz being preferred for the source power. Wattages can range from a few hundred watts to several thousand watts and is discussed further below. The power applied to the substrate pedestal 216 may also be DC.

One particularly preferred plasma processing chamber for carrying out the present invention is a Silicon DPS Chamber available from Applied Materials, Inc. of Santa Clara, Calif. This plasma-processing chamber enables the processing of up to 12-inch (300 mm) diameter silicon substrate surface.

Figure 2A:
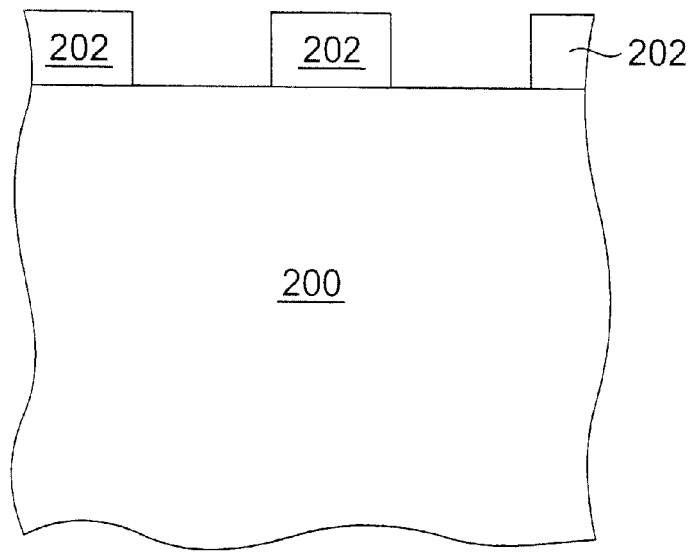
FIGS. 2A and 2B are schematic partial cross-sectional views illustrating the etching of trenches according to an embodiment of the invention.
Figure 2B:
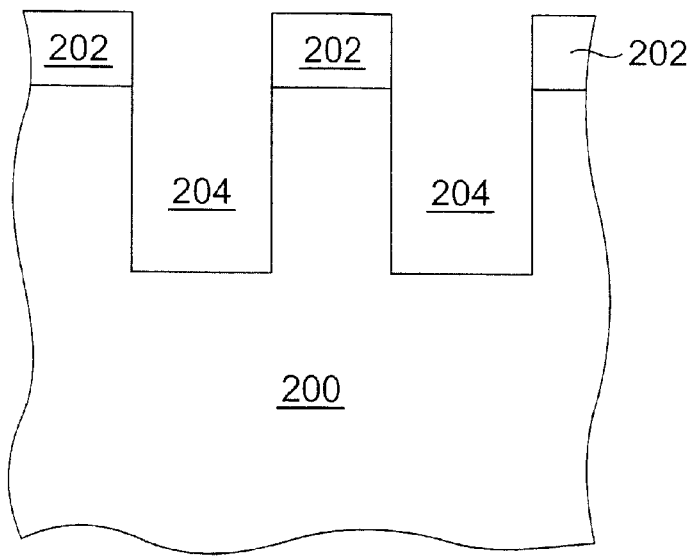

A procedure for providing trench isolation, according to an embodiment of the invention, will now be briefly discussed in connection with FIGS. 2A and 2B. As shown in FIG. 2A, a patterned resist layer 202 is applied over a substrate 200. The structure is then etched in accordance with the method of the present invention to provide trenches 204 within the substrate 200.

More specifically, the substrate 200 materials for use in connection with the present invention are silicon substrate materials. The silicon substrate materials can be, for example, single-crystal silicon, polycrystalline silicon, amorphous silicon, or any combination of the above. The silicon substrate materials can be either be doped or undoped.

Trenches 204 commonly range from 1 to 4 microns in depth and from 0.15 to 10 microns in width, more commonly 0.5 to 5 microns in width. Typically, the trench bottoms are substantially flat. Trench sidewalls can be vertical (i.e., 90°), reentrant (i.e., >90°) or tapered (i.e., <90°).

The resists 202 for use in connection with the present invention can be essentially any resist known in the art. Photoresists are preferred, more preferably deep-ultra-violet (deep-UV) resists and i-line photoresists. If desired, an anti-reflective coating can optionally be applied beneath the photoresist as is known in the art.

The process of the present invention is a relatively low-pressure process, with pressures being less than 100 mT, more preferably 5–70 mT, and most preferably 10–20 mT.

Preferred plasma source gases for use in connection with the present invention comprise $SF_6$ and one or more fluorocarbon gases. $N_2$ is also preferably provided. Relative to conventional $HBr/Cl_2$ chemistry, and as discussed further below, this chemistry provides high etching rates (e.g., 0.5 to 2 microns per minute) and high silicon:resist selectivity (e.g., 3:1 to 6:1). At the same time, this chemistry provides smooth sidewalls, little or no gain in critical dimension (CD) as desired, and the ability to provide vertical, reentrant or tapered sidewalls as desired. While not wishing to be bound by theory, the function of each of these etching gases is described below.

The $SF_6$ and the one or more fluorocarbon gases are added to provide fluorine and fluorine radicals upon dissociation. Fluorine acts to etch silicon in a manner that is both isotropic and aggressive. Plasma dissociation of the fluorocarbon gases further produces species that deposit and polymerize on the trench sidewall, forming a passivating layer of Teflon-like polymer. The fluorocarbon gases also provide a Teflon-like polymer on the resist surface, preserving the resist and providing improved selectivity.

A pure $SF_6$-based etch tends to be highly isotropic due to absence of sidewall passivation, whereas a pure fluorocarbon-based etch tends to deposit too much polymer and thus does not etch silicon to any significant degree. As a result, both are included.

Preferred fluorocarbon gases for the practice of the present invention are $CHF_3$, $CH_2F_2$ and/or $C_4F_8$, with $CHF_3$ being preferred. Where $CHF_3$ is used, the $SF_6$:$CHF_3$ ratio preferably ranges from 1:1 to 1:10, more preferably 1:3 to 1:8. One unique feature of this particular chemistry is that the silicon etch rate increases significantly as the $SF_6$/$CHF_3$ ratio increases, while the resist etch rate goes up only slightly. As a result, the silicon:resist selectivity almost doubles as the $SF_6$:$CHF_3$ ratio is varied from 1:8 to 1:3. As for the effect on the trench profile, at a $SF_6$/$CHF_3$ ratio of 1:8, the trench profile is tapered with smooth sidewalls. As the ratio is changed to 1:3, one would expect the profile to become increasingly undercut/re-entrant, due to the increase in $SF_6$. Instead, at a 1:3 $SF_6$:$CHF_3$ ratio, the profile is vertical with no undercut, although there is a slight gain in the trench CD. As a result, for a $SF_6$:$CHF_3$ ratio of 1:3, it is possible to produce vertical trench profiles, while also achieving high trench etch rates (e.g., on the order of 1.4 microns/min) with high resist selectivity (e.g., on the order of 5:1).

Although the above-noted gain in trench CD can be compensated for during the lithography step, it is preferable to address the trench CD gain by modifying the process chemistry. In particular, and in accordance with the present invention, $N_2$ can be included as an additional sidewall passivation species. The $N_2$ acts to passivate the sidewall, with this passivation believed to be a result of C—N interaction. By passivating the sidewall in this manner, CD gain is prevented. Moreover, where encountered, re-entrant trench profiles are prevented by the addition of $N_2$. Preferably, the ratio of $(SF_6+CHF_3):N_2$ varies from 1:3 to 5:1, and more preferably from 1:2 to 2:1. As a specific example, when etching at an $SF_6:CHF_3$ ratio of about 1:5 and an $(SF_6+CHF_3):N_2$ ratio of about 2:1, etch rates of about 0.75 micron/min (about 2.5 times the conventional $HBr/Cl_2$ chemistry etch rate) can be achieved, with vertical trench profiles, smooth sidewalls, and no CD gain.

In some embodiments of the invention, $Cl_2$ is added to the process chemistry. Preferably, from 0–80% $Cl_2$ (relative to the $SF_6$) is added to the process chemistry. By adding $Cl_2$, sidewall taper can be increased (for example, from 90 degrees to 88 degrees), with increasing $Cl_2$ concentrations resulting in increased taper. At the same time, the high etch rate and high silicon:resist selectivity of the process of the present invention are preserved.

The source and bias power effects of the present invention also differ from those observed with traditional $HBr/Cl_2$ chemistry. For example, as source power is increased (e.g., from 700W to 1200 W), the profile becomes more tapered, with only a slight increase (e.g., 5%) in the etch rate and with some microtrenching at the trench bottom occurring. In contrast, an increase in bias power (e.g., from 50 to 100 W) resulted in a substantial increase in the etch rate (e.g., 32%), without having a significant effect on the trench profile. Both these effects suggest that, for a given $SF_6:CHF_3$ ratio, the etch rate is limited by the ion flux arriving at the trench bottom (which leads to excess polymer deposition), rather than the reactant flux (which leads to etching). With higher source power (higher dissociation) there is additional polymer that is deposited in the trench making the profiles more tapered. Also, ion deflection from the tapered sidewalls causes excess ion flux at the trench corners resulting in microtrenching.

An embodiment of the process of the present invention is exemplified as follows: A silicon substrate is obtained, and a patterned layer of deep-UV photoresist is applied. Trenches are etched through apertures in the patterned resist layer using a plasma source gas composed of $CHF_3$, $SF_6$, $N_2$ and optionally $Cl_2$. Desirable results can be obtained, for example, by operating a DPS etching system such as that described above within the flowing parameters: $CHF_3$ flow rate: 50–150 sccm (standard cubic centimeters per minute), $SF_6$ flow rate: 5–30 sccm, $N_2$ flow rate: 50–150 sccm, $Cl_2$ flow rate: 0–25 sccm, pressure: 5–70 mT, source power is 400–1500W, bias power 30–250W.

All of the features disclosed in this specification (including any accompanying claims, abstract and drawings), and/or all of the steps of any method or process so disclosed, may be combined in any combination, except for combinations where at least some of the features and/or steps are mutually exclusive.

Each feature disclosed in this specification (including any accompanying claims, abstract, and drawings), may be replaced by alternative features serving the same equivalent or similar purpose, unless expressly stated otherwise. Thus, unless expressly stated otherwise, each feature disclosed is one example only of a generic series of equivalent or similar features.

What is claimed is:

1. A method of forming a trench within a silicon substrate, said method comprising:
   providing a masked substrate, said masked substrate comprising: (a) a silicon substrate and (b) a patterned resist layer over said silicon substrate, said patterned resist layer having one or more apertures formed therein; and
   forming a trench in said substrate through said apertures in said resist layer by an inductive plasma etching step, said etching step being conducted using plasma source gases that comprise $SF_6$, at least one fluorocarbon gas, and $N_2$, wherein said etching step is performed at a plasma density ranging from $5 \times 10^{10}$ to $5 \times 10^{12}$ $cm^{-3}$.

2. The method of claim 1, wherein said etching step is performed at a pressure ranging from 5 to 70 mT.

3. The method of claim 1, wherein said etching step is performed at a pressure ranging from 10 to 20 mT.

4. The method of claim 1, wherein said silicon substrate is a single-crystal silicon substrate.

5. The method of claim 1, wherein said trench ranges from 1 to 4 microns in depth.

6. The method of claim 1, wherein said resist is selected from a deep-ultra-violet resist and an i-line photoresist.

7. The method of claim 1, wherein said etching step provides a silicon:resist selectivity ranging from 3:1 to 6:1.

8. The method of claim 1, wherein said etching step provides an etching rate ranging from 0.5 to 2 microns per minute.

9. The method of claim 1, wherein said fluorocarbon gas is selected from one or more of $CHF_3$, $CH_2F_2$ and $C_4F_8$.

10. The method of claim 1, wherein said fluorocarbon gas comprises $CHF_3$.

11. The method of claim 10, wherein an $SF_6:CHF_3$ volume ratio ranges from 1:1 to 1:10.

12. The method of claim 11, wherein said $SF_6:CHF_3$ volume ratio ranges from 1:3 to 1:8.

13. The method of claim 1, wherein a $(SF_6+CHF_3):N_2$ volume ratio ranges from 1:3 to 5:1.

14. The method of claim 13, wherein said $(SF_6+CHF_3):N_2$ volume ratio ranges from 1:2 to 2:1.

15. The method of claim 1, wherein said plasma source gases further comprise $Cl_2$.

16. The method of claim 15, wherein said $Cl_2$ is present in an amount that ranges from 1 to 80% of the volume of $SF_6$ present in the source gases.

17. The method of claim 15, wherein said $Cl_2$ is present in an amount that ranges from 5 to 40% of the volume of $SF_6$ present in the source gases.

18. The method of claim 15, wherein said trench has a sidewall ranging from 88 to 89 degrees in taper.

19. The method of claim 1, wherein said etching step is conducted at a pressure ranging from 5 to 70 mT using plasma source gases that comprise $CHF_3$, $SF_6$ and $N_2$, wherein an $SF_6:CHF_3$ volume ratio of ranges from 1:1 to 1:10 and wherein an $(SF_6+CHF_3):N_2$ volume ratio ranges from 1:3 to 5:1.

20. The method of claim 19, wherein said $SF_6:CHF_3$ volume ratio ranges from 1:3 to 1:8.

21. The method of claim 20, wherein said $(SF_6+CHF_3):N_2$ volume ratio ranges from 1:2 to 2:1.

22. The method of claim 19, wherein said plasma source gases further comprise $Cl_2$, wherein said $Cl_2$ is present in an amount that ranges from 1 to 80% of the volume of $SF_6$ present in the source gases.

23. The method of claim 22, wherein said $Cl_2$ is present in an amount that ranges from 5 to 40% of the volume of $SF_6$ present in the source gases.

* * * * *